(12) United States Patent
Lee et al.

(10) Patent No.: US 11,749,754 B2
(45) Date of Patent: *Sep. 5, 2023

(54) ACTIVE PATTERN STRUCTURE AND SEMICONDUCTOR DEVICE INCLUDING THE SAME

(71) Applicant: SAMSUNG ELECTRONICS CO., LTD., Suwon-si (KR)

(72) Inventors: Sangmoon Lee, Seoul (KR); Kyungin Choi, Suwon-si (KR); Seunghun Lee, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/550,712

(22) Filed: Dec. 14, 2021

(65) Prior Publication Data
US 2022/0109065 A1     Apr. 7, 2022

Related U.S. Application Data

(63) Continuation of application No. 16/887,900, filed on May 29, 2020, now Pat. No. 11,233,151.

(30) Foreign Application Priority Data

Nov. 8, 2019 (KR) .................. 10-2019-0142901

(51) Int. Cl.
| | | |
|---|---|---|
| *H01L 31/113* | (2006.01) | |
| *H01L 31/119* | (2006.01) | |
| *H01L 29/78* | (2006.01) | |
| *H01L 29/06* | (2006.01) | |
| *H01L 29/66* | (2006.01) | |
| *H01L 29/417* | (2006.01) | |

(52) U.S. Cl.
CPC ........ *H01L 29/785* (2013.01); *H01L 29/0649* (2013.01); *H01L 29/41791* (2013.01); *H01L 29/6681* (2013.01)

(58) Field of Classification Search
CPC .............. H01L 29/785; H01L 29/0649; H01L 29/41791; H01L 29/6681; H01L 29/66795; H01L 29/0603; H01L 29/0684; H01L 21/02145; H01L 27/0886; H01L 29/7843; H01L 29/7848
USPC ....................................... 257/365
See application file for complete search history.

(56) References Cited

U.S. PATENT DOCUMENTS

| | | |
|---|---|---|
| 4,781,766 A | 11/1988 | Barnett et al. |
| 9,178,067 B1 | 11/2015 | Ching et al. |
| 9,196,522 B2 | 11/2015 | Ching et al. |
| 9,209,303 B2 | 12/2015 | Ching et al. |
| 9,219,116 B2 | 12/2015 | Ching et al. |
| 9,412,871 B2 | 8/2016 | Doornbos et al. |
| 9,548,355 B1 | 1/2017 | Cheng et al. |
| 9,773,705 B2 | 9/2017 | Ching et al. |
| 9,941,406 B2 | 4/2018 | Ching et al. |
| 11,233,151 B2 * | 1/2022 | Lee .................. H01L 29/66795 |

(Continued)

*Primary Examiner* — Theresa T Doan
(74) *Attorney, Agent, or Firm* — Myers Bigel, P.A.

(57) ABSTRACT

An active pattern structure includes a lower active pattern protruding from an upper surface of a substrate in a vertical direction substantially perpendicular to an upper surface of the substrate, a buffer structure on the lower active pattern, at least a portion of which may include aluminum silicon oxide, and an upper active pattern on the buffer structure.

9 Claims, 19 Drawing Sheets

(56) References Cited

U.S. PATENT DOCUMENTS

2016/0126343 A1 5/2016 Ching et al.
2017/0117140 A1 4/2017 Tak et al.

* cited by examiner

ACTIVE PATTERN STRUCTURE AND SEMICONDUCTOR DEVICE INCLUDING THE SAME

CROSS-REFERENCE TO RELATED APPLICATIONS

This application is a continuation of U.S. patent application Ser. No. 16/887,900, filed May 29, 2020, which itself claims priority under 35 USC § 119 to Korean Patent Application No. 10-2019-0142901, filed on Nov. 8, 2019, in the Korean Intellectual Property Office (KIPO), the contents of both of which are herein incorporated by reference in their entireties.

BACKGROUND

Example embodiments relate to an active pattern structure and a semiconductor device including the same. More particularly, example embodiments relate to a finFET including a buffer structure.

When an active fin is formed during the fabrication of a finFET, the active fin may have a width increasing from an upper portion to a lower portion due to the characteristics of a patterning process, and thus currents may concentrate on the upper portion of the active fin or leakage currents may be generated in the lower portion of the active fin. Particularly, due to the scale down of the active fin, the leakage currents may increase in the lower portion of the active fin.

SUMMARY

Example embodiments provide an active pattern structure having improved characteristics.

Example embodiments provide a semiconductor device having improved characteristics.

According to some embodiments of the inventive concept, there is provided an active pattern structure. The active pattern structure may include a lower active pattern protruding from an upper surface of a substrate in a vertical direction substantially perpendicular to an upper surface of the substrate, a buffer structure on the lower active pattern, at least a portion of which may include aluminum silicon oxide, and an upper active pattern on the buffer structure.

According to some embodiments of the inventive concept, there is provided an active pattern structure. The active pattern structure may include a lower active pattern protruding from an upper surface of a substrate in a vertical direction substantially perpendicular to an upper surface of the substrate, a buffer on the lower active pattern including silicon doped with aluminum, and an upper active pattern having a width increasing from an upper portion of the upper active pattern towards a lower portion of the upper active pattern. A minimum width of the buffer may be equal to or less than a width of an upper surface of the upper active pattern.

According to some embodiments of the inventive concept, there is provided a semiconductor device. The semiconductor device may include an active pattern structure on a substrate, an isolation pattern on the substrate, a gate electrode structure on the active pattern structure, and a source/drain layer. The active pattern structure may include a lower active pattern protruding from an upper surface of the substrate in a vertical direction substantially perpendicular to an upper surface of the substrate, a buffer structure on the lower active pattern at least a portion of which may include aluminum silicon oxide, and an upper active pattern on the buffer structure. The isolation pattern may overlap at least a portion of a sidewall of the active pattern structure. The source/drain layer may be on a portion of the active pattern structure adjacent the gate electrode structure.

The semiconductor device in accordance with example embodiments may include the lower active pattern protruding from the upper surface of the substrate, at least a portion of a buffer structure that includes aluminum silicon oxide on the lower active pattern, and an upper active pattern on the buffer structure. Thus, the width of an area where the lower and upper active patterns contact may be reduced so that leakage currents therebetween may be also reduced.

DETAILED DESCRIPTION

Active pattern structures and semiconductor devices including the same in accordance with example embodiments will be described more fully hereinafter with reference to the accompanying drawings.

FIGS. 1 to 4 are cross-sectional views illustrating a method of forming an active pattern structure in accordance with example embodiments.

Figure 1:
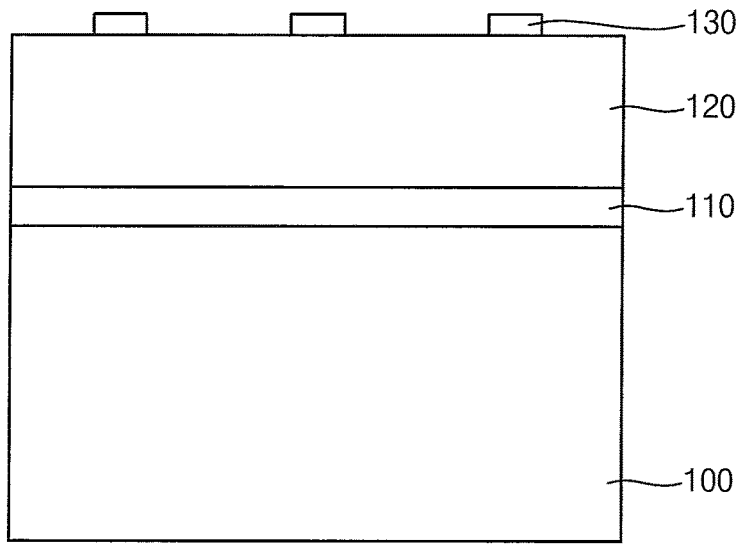
FIGS. 1 to 4 are cross-sectional views illustrating a method of forming an active pattern structure in accordance with example embodiments.

Referring to FIG. 1, a first buffer layer 110, a semiconductor layer 120 and a first mask 130 may be sequentially formed on a substrate 100.

The substrate 100 may include silicon, germanium, silicon-germanium, etc., or III-V compounds e.g., GaP, GaAs, GaSb, etc. In some embodiments, the substrate 100 may be a silicon-on-insulator (SOI) substrate or a germanium-on-insulator (GOI) substrate.

The first buffer layer 110 may include silicon doped with impurities having an oxidation reaction greater than those of the substrate 100 and the semiconductor layer 120, e.g., silicon doped with aluminum.

The semiconductor layer 120 may include silicon, germanium, silicon-germanium, etc., or III-V compounds e.g., GaP, GaAs, GaSb, etc. In some embodiments, the semiconductor layer 120 may include substantially the same material as the substrate 100.

In example embodiments, the first mask 130 may extend in a first direction substantially parallel to an upper surface of the substrate 100, and a plurality of first masks 130 may be formed in a second direction substantially parallel to the upper surface of the substrate 100 and crossing the second direction. In example embodiments, the first and second directions may be orthogonal or perpendicular to each other.

Figure 2:
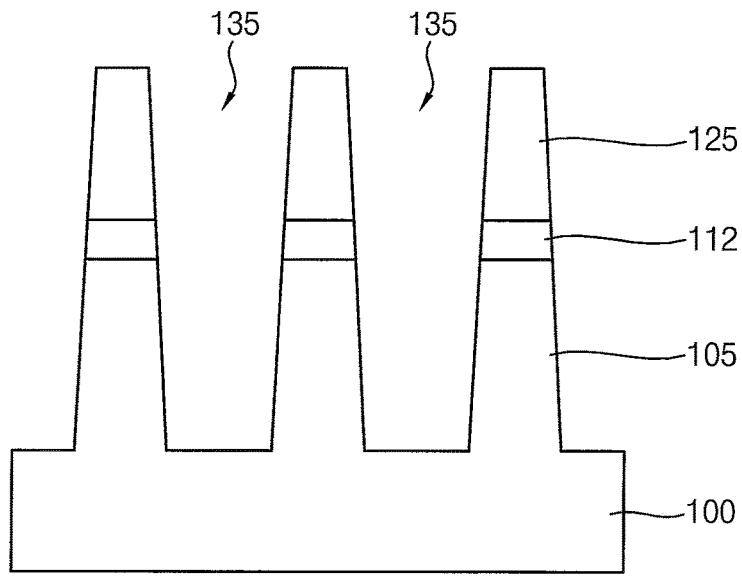

Referring to FIG. 2, the semiconductor layer 120, the first buffer layer 110 and the substrate 100 may be etched using the first mask 130 as an etching mask.

Thus, a fin structure including a first lower active pattern 105, a first buffer 112 and a first upper active pattern 125 sequentially stacked may be formed. The fin structure may extend in the first direction, and a plurality of fin structures may be formed in the second direction.

A first recess 135 may be formed between fins of the fin structure neighboring in the second direction. That is, the fins of the fin structure may be spaced apart from each other in the second direction by the first recess 135.

The etching process may include a quadruple patterning (QPT) process, an extreme ultraviolet (EUV) lithography process, etc.

In example embodiments, the first lower active pattern 105 and the first upper active pattern 125 may include substantially the same material.

In example embodiments, each of the first lower active pattern 105 and the first upper active pattern 125 may have a width increasing from an upper portion to a lower portion thereof that is closer to the substrate 100. In some example embodiments, an upper surface of the first buffer 112 may have a width greater than that of the first upper active pattern 125.

After the etching process, the first mask 130 may be removed.

Figure 3:
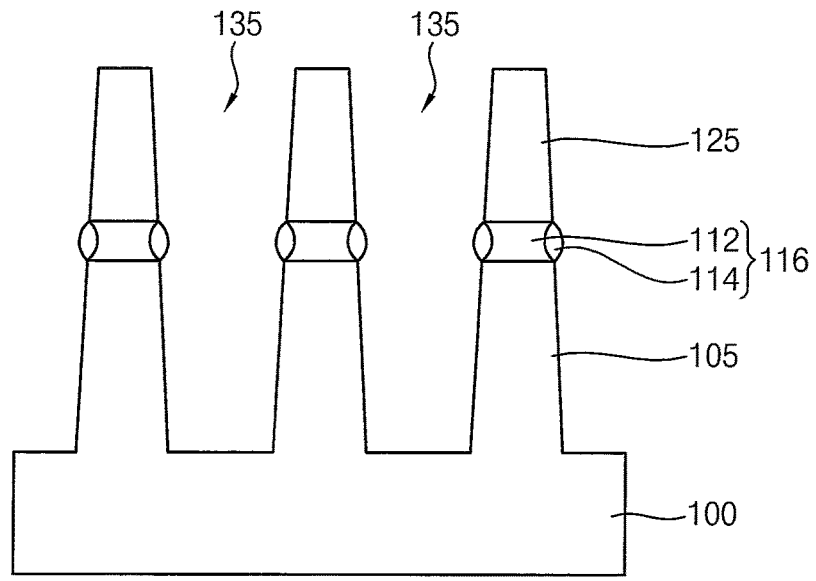

Referring to FIG. 3, a sidewall of the first buffer 112 exposed by the first recess 135 may be partially oxidized.

Thus, a second buffer 114 may be formed at each of opposite sidewalls of the first buffer 112 in the second direction. The first and second buffers 112 and 114 may form a buffer structure 116, and the first lower active pattern 105, the buffer structure 116 and the first upper active pattern 125 may form an active pattern structure. The first lower active pattern 105 and the first upper active pattern 125 may be referred to as a first active pattern 150.

In example embodiments, the first lower active pattern 105 and the first upper active pattern 125 may be spaced apart from each other in the vertical direction by the buffer structure 116.

In example embodiments, the second buffer 114 may protrude from the first active pattern 150 in the second direction.

The first buffer 112 may include a material having an oxidation reaction greater than those of the substrate 100, the first lower active pattern 105 and/or the first upper active pattern 125. Thus when an oxidation reaction is performed at the first buffer 112, the substrate 100, the first lower active pattern 105 and the first upper active pattern 125 may not be oxidized or may be less oxidized.

In example embodiments, the first buffer 112 may have a concave sidewall in the second direction, and the second buffer 114 may have a convex shape in the second direction.

In example embodiments, the second buffer 114 may have a width gradually decreasing from a central portion toward an upper portion or a lower portion thereof in the vertical direction.

In example embodiments, a sidewall of the second buffer 114 may have a slope with respect to the upper surface of the substrate 100 that may gradually change in the vertical direction.

The second buffer 114 may include an oxide, e.g., aluminum silicon oxide.

Figure 4:
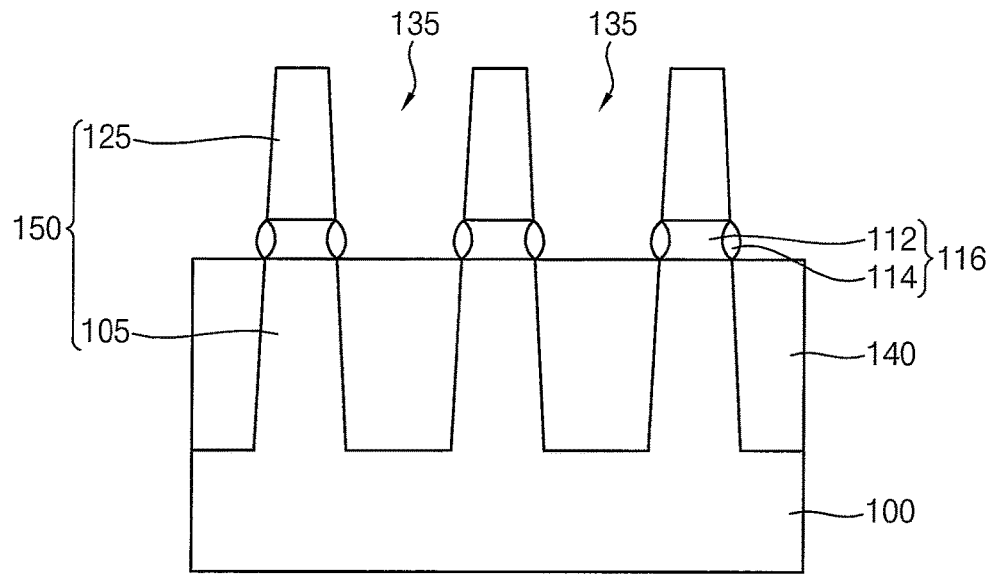

Referring to FIG. 4, an isolation pattern 140 may be formed to partially fill the first recess 135 between the fin structures.

Particularly, the isolation pattern 140 may be formed by forming an isolation layer on the substrate 100 and the active pattern structure, planarizing the isolation layer until an upper surface of the first upper active pattern 125 may be exposed, and removing an upper portion of the isolation layer.

In example embodiments, the isolation pattern 140 may cover or overlap a sidewall of the first lower active pattern 105, but may not cover or overlap sidewalls of the buffer structure 116 and the first upper active pattern 125.

The isolation pattern 140 may include an oxide, e.g., silicon oxide.

As illustrated above, the first buffer layer 110 and the semiconductor layer 120 may be sequentially stacked on the substrate 100, and the semiconductor layer 120, the first buffer layer 110 and an upper portion of the substrate 100 may be etched to form the first upper active pattern 125, the first buffer 112 and the first lower active pattern 105, respectively, and an oxidation process may be performed on the first buffer 112 to form the second buffer 114 on the sidewall of the first buffer 112. The first buffer 112 may include the material having a high oxidation reaction, and thus the first active pattern 150 may not be oxidized or less oxidized by the oxidation process, so that only the first buffer 112 may be selectively oxidized.

Accordingly, the second buffer 114 including an oxide having a band gap greater than those of the first lower active pattern 105 and the first upper active pattern 125 may be interposed between the first lower active pattern 105 and the first upper active pattern 125. The first buffer 112 not including an oxide may have a width smaller than that of the first upper active pattern 125, so that leakage currents from the first upper active pattern 125 to the first lower active pattern 105 may be reduced.

Figure 5:
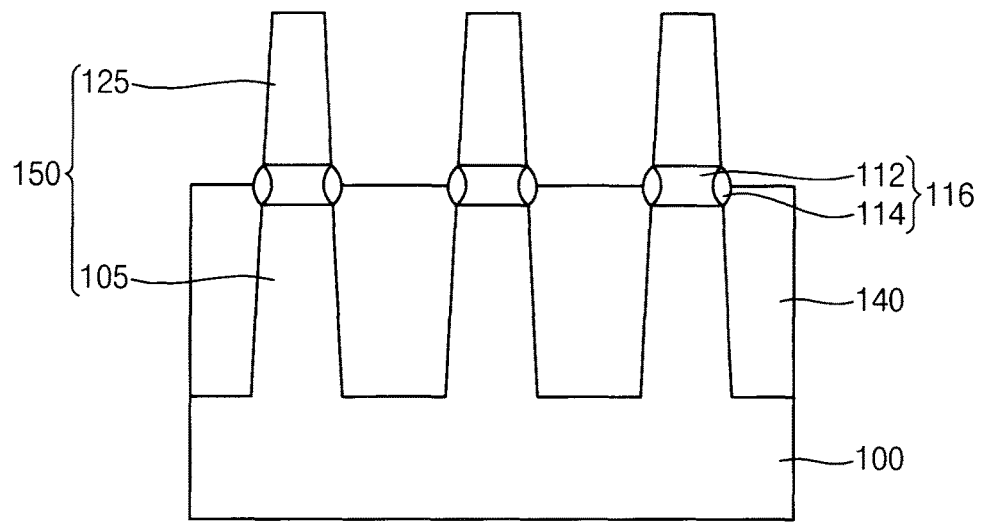
FIGS. 5 to 7 are cross-sectional views illustrating active pattern structures in accordance with example embodiments.
Figure 6:
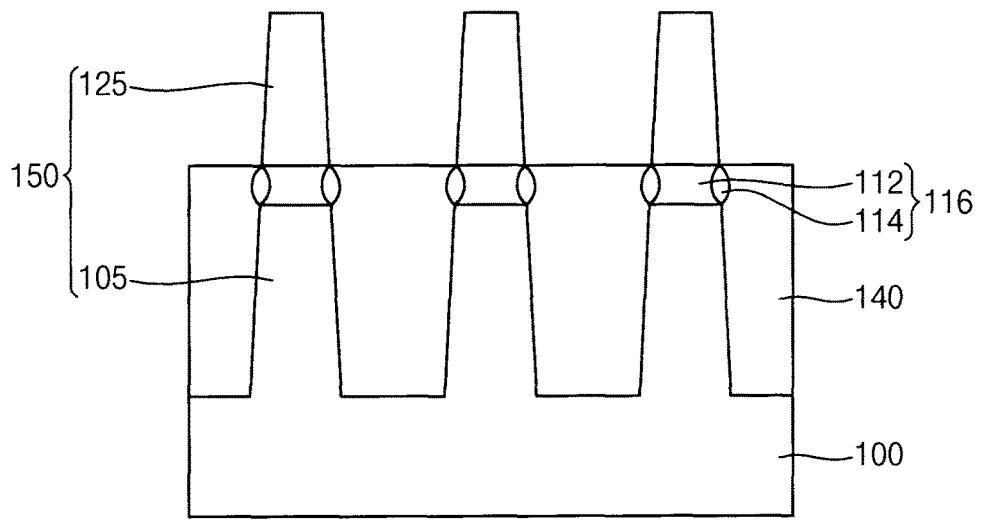
Figure 7:
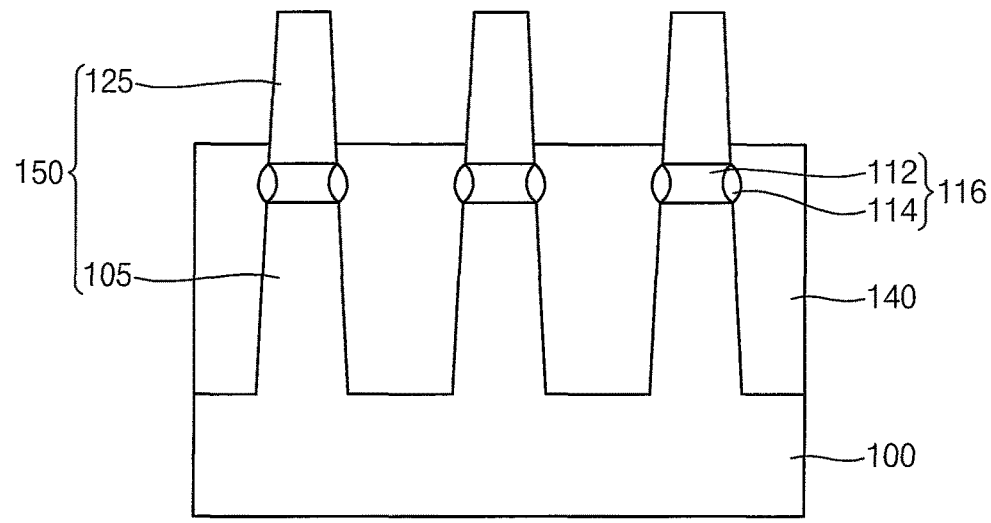

FIGS. 5 to 7 are cross-sectional views illustrating active pattern structures in accordance with example embodiments.

These active pattern structures may be substantially the same as or similar to that of FIG. 4, except for a height of the isolation pattern. Thus, like reference numerals refer to like elements, and detailed descriptions thereon are omitted herein.

Referring to FIG. 5, the isolation pattern 140 may cover or overlap a sidewall of the first lower active pattern 105 and a lower sidewall of the buffer structure 116, but may not cover or overlap an upper sidewall of the buffer structure 116 and a sidewall of the first upper active pattern 125.

Referring to FIG. 6, the isolation pattern 140 may cover or overlap a sidewall of the first lower active pattern 105 and a sidewall of the buffer structure 116, but may not cover or overlap a sidewall of the first upper active pattern 125.

Referring to FIG. 7, the isolation pattern 140 may cover or overlap a sidewall of the first lower active pattern 105, a sidewall of the buffer structure 116, and a lower sidewall of the first upper active pattern 125, but may not cover or overlap an upper sidewall of the first upper active pattern 125.

That is, the isolation pattern 140 may entirely cover or entirely overlap a sidewall of the first lower active pattern 105, however, may cover or overlap entirely or partially cover or overlap a sidewall of the buffer structure 116. Additionally, the isolation pattern 140 may partially cover or partially overlap a sidewall of the first upper active pattern 125.

Figure 8:
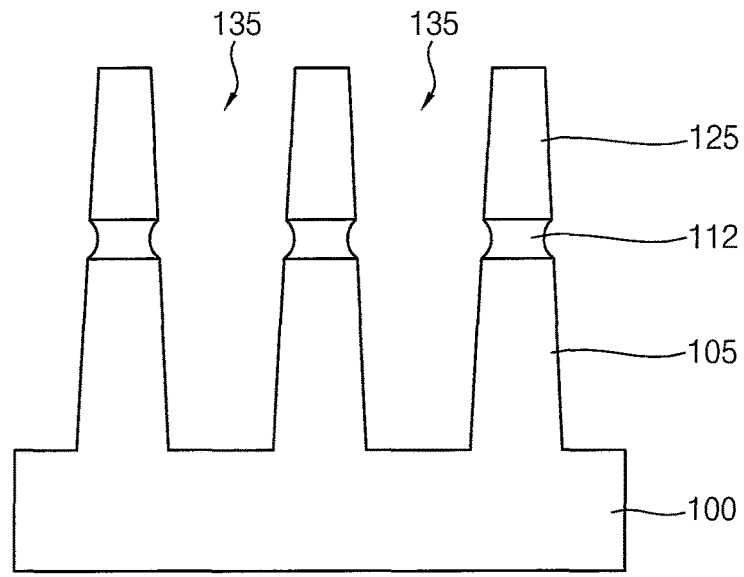
FIGS. 8 and 9 are cross-sectional views illustrating a method of forming an active pattern structure in accordance with example embodiments.
Figure 9:
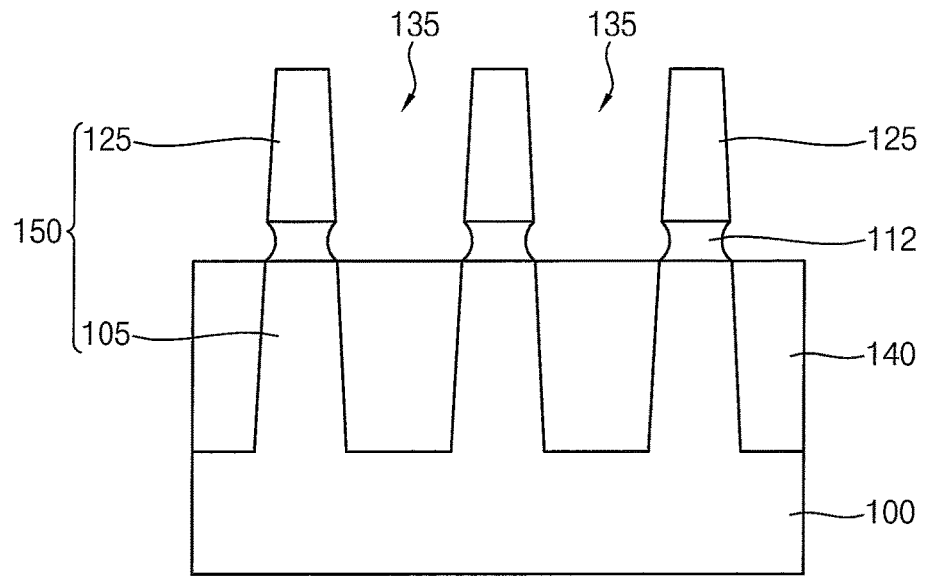

FIGS. 8 and 9 are cross-sectional views illustrating a method of forming an active pattern structure in accordance with example embodiments.

This method may include processes substantially the same as or similar to those illustrated with reference to FIGS. 1 to 3, and thus repetitive explanations are omitted herein.

Referring to FIG. 8, processes substantially the same as or similar to FIGS. 1 to 3 may be performed, and the second buffer 114 may be removed. Thus, a sidewall of the first buffer 112 may be removed by the first recess 135.

In example embodiments, the first buffer 112 may have a width gradually increasing from a central portion toward an upper portion or a lower portion thereof in the vertical direction that is perpendicular to the substrate 100.

In example embodiments, the sidewall of the first buffer 112 may have a slope with respect to the upper surface of the substrate 100 that may gradually change in the vertical direction.

In example embodiments, a minimum width of the first buffer 112 may be equal to or less than a width of an upper surface of the first upper active pattern 125.

Referring to FIG. 9, processes substantially the same as or similar to FIG. 4 may be performed, and thus the isolation pattern 140 may be formed to cover or overlap a sidewall of the first lower active pattern 105.

In example embodiments, an upper surface of the isolation pattern 140 may be lower than an upper surface of the first buffer 112. In some embodiments, the upper surface of the isolation pattern 140 may be substantially coplanar with a lower surface of the first buffer 112.

As illustrated above, the first buffer 112 may be formed between the first lower active pattern 105 and the first upper active pattern 125 to include a portion having a width smaller than that of a lower surface of the first upper active pattern 125, and thus leakage currents from the first upper active pattern 125 to the first lower active pattern 105 may be reduced.

Figure 10:
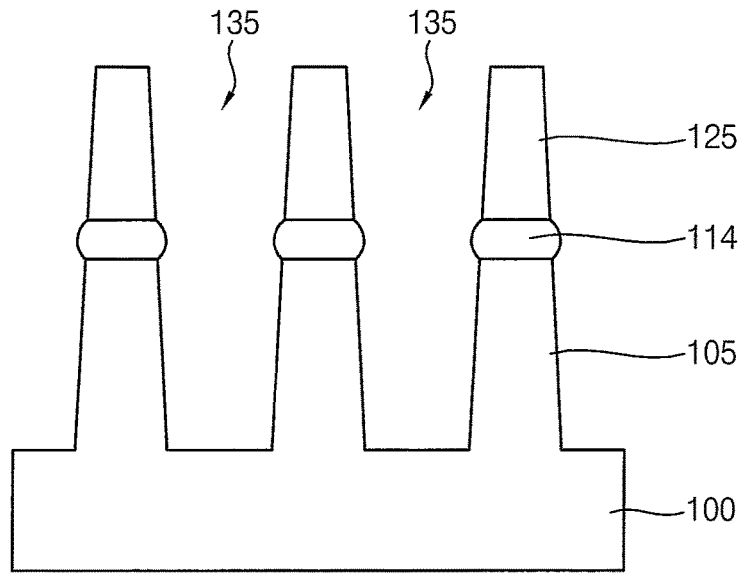
FIGS. 10 and 11 are cross-sectional views illustrating a method of forming an active pattern structure in accordance with example embodiments.
Figure 11:
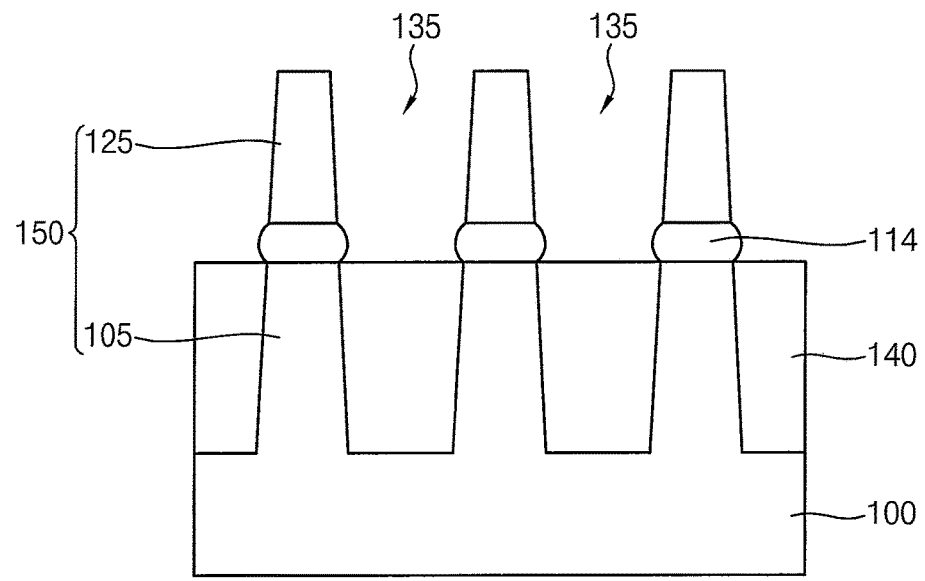

FIGS. 10 and 11 are cross-sectional views illustrating a method of forming an active pattern structure in accordance with example embodiments.

This method may include processes substantially the same as or similar to those illustrated with reference to FIGS. 1 to 4, and thus repetitive explanations are omitted herein.

Referring to FIG. 10, processes substantially the same as or similar to those illustrated with reference to FIGS. 1 to 3 may be performed.

However, the first buffer 112 may be entirely oxidized to form the second buffer 114, and the first lower active pattern 105 and the first upper active pattern 125 may be spaced apart from each other by the second buffer 114.

Particularly, the first buffer 112 may include the material having a high oxidation reaction so as to be easily oxidized, and thus not only the sidewalls but also a central portion between the sidewalls may be entirely oxidized.

In example embodiments, the second buffer 114 may have a width gradually decreasing from a central portion toward an upper portion or a lower portion thereof in the vertical direction.

Referring to FIG. 11, processes substantially the same as or similar to those illustrated with reference to FIG. 4 may be performed to form the isolation pattern 140 covering or overlapping a sidewall of the first lower active pattern 105.

As illustrated above, the first lower active pattern 105 and the first upper active pattern 125 may be spaced apart from each other by the second buffer 114 including an oxide, and thus leakage currents from the first upper active pattern 125 to the first lower active pattern 105 may be reduced.

FIGS. 12 to 18 are cross-sectional views illustrating a method of forming an active pattern structure in accordance with example embodiments.

Figure 12:
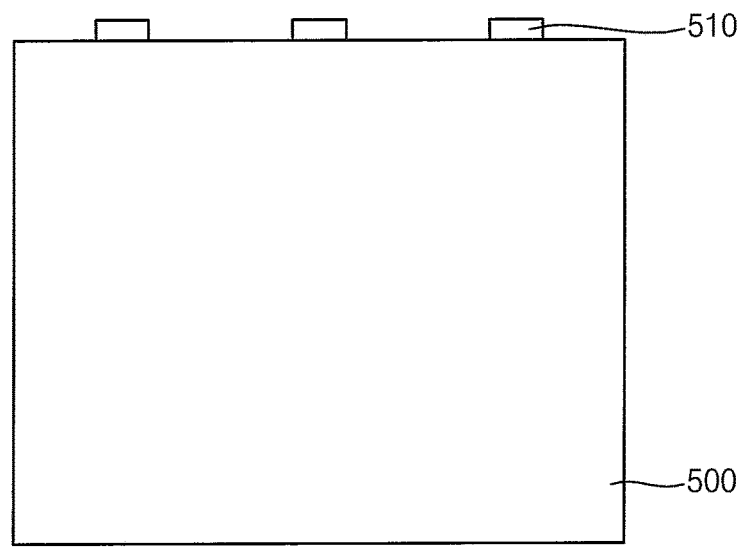
FIGS. 12 to 18 are cross-sectional views illustrating a method of forming an active pattern structure in accordance with example embodiments.
Figure 13:
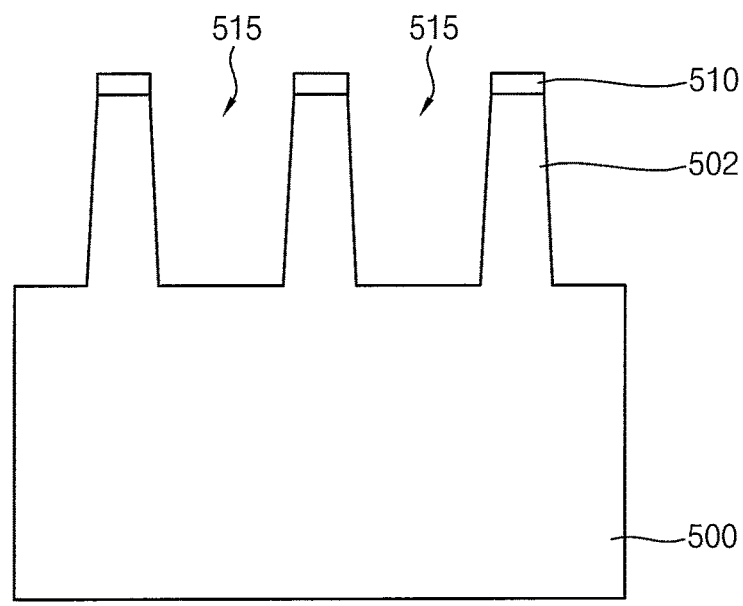

Referring to FIGS. 12 and 13, a second mask 510 may be formed on a substrate 500, and an upper portion of the substrate 500 may be partially etched using the second mask 510 as an etching mask to form a second active pattern 502 protruding from an upper surface of the substrate 500 in the vertical direction that is perpendicular to the substrate.

The substrate 500 may include silicon, germanium, silicon-germanium, etc., or III-V compounds e.g., GaP, GaAs, GaSb, etc. In some embodiments, the substrate 500 may be a silicon-on-insulator (SOI) substrate or a germanium-on-insulator (GOI) substrate.

In example embodiments, the second active pattern 502 may extend in the first direction, and a plurality of second active patterns 502 may be formed in the second direction. A second recess 515 may be formed between ones of the second active patterns 502 neighboring in the second direction. That is, the second active patterns 502 may be spaced apart from each other in the second direction by the second recess 515.

Figure 14:
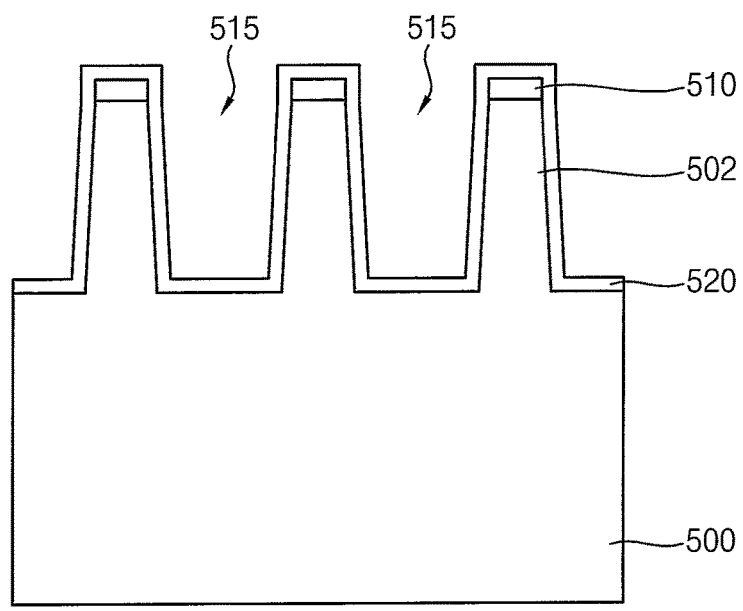
Figure 15:
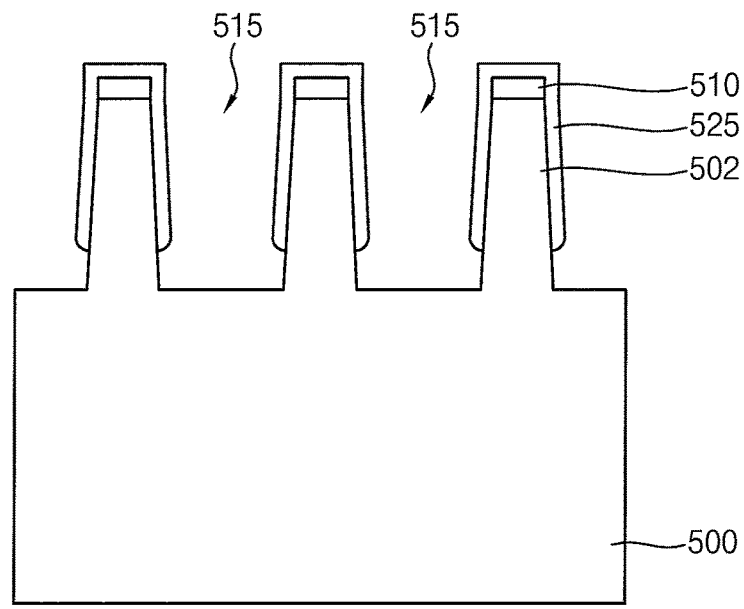

Referring to FIGS. 14 and 15, a third mask layer 520 may be formed on the substrate 500, the second active pattern 502, and the second mask 510, and the third mask layer 520 may be partially etched to expose an upper surface of the substrate 100 and a lower portion of the second active pattern 502. Thus, a third mask 525 may be formed to cover or overlap the second mask 510 and an upper portion of the second active pattern 502.

In example embodiments, the second and third masks 510 and 525 may include substantially the same material, and thus may be merged with each other.

Figure 16:
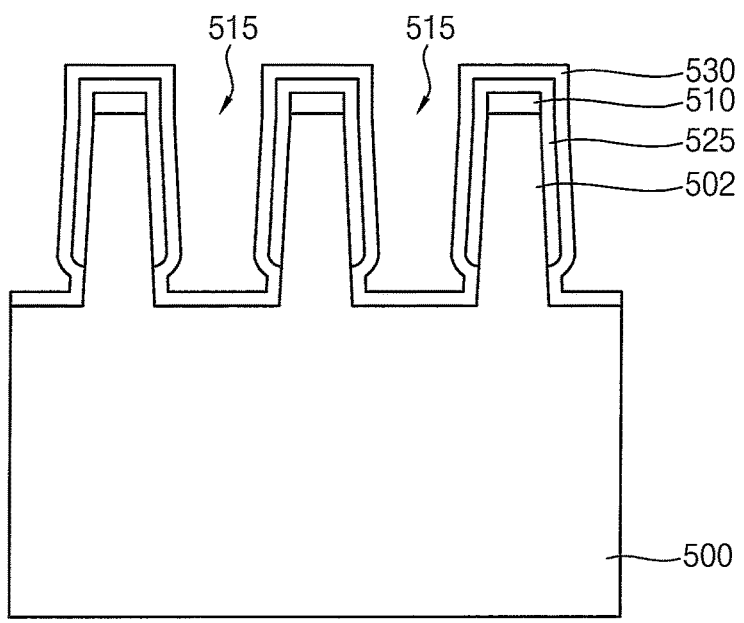

Referring to FIG. 16, a second buffer layer 530 may be formed on the exposed upper surface of the substrate 500, the exposed lower portion of the second active pattern 502, and the second and third masks 510 and 525.

The second buffer layer 530 may include a material having an oxidation reaction greater than that of the substrate 500, e.g., silicon doped with aluminum.

Figure 17:
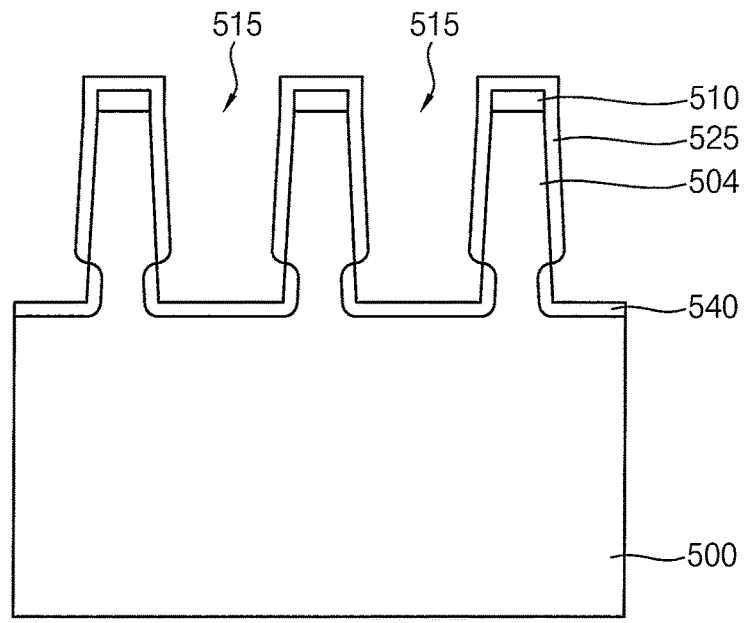

Referring to FIG. 17, the second buffer layer 530 may be entirely oxidized, and the oxidized second buffer layer 530 may be removed.

The second buffer layer 530 includes silicon doped with aluminum and the substrate 500 and the second active pattern 502 include undoped silicon or undoped silicon-germanium, and thus aluminum included in the second buffer layer 530 may be diffused into portions of the substrate 500 and the second active pattern 502 contacting the second buffer layer 530. Additionally, the portions of the substrate 500 and the second active pattern 502 contacting the second buffer layer 530 may be also oxidized.

Accordingly, a third buffer layer 540 may be formed at a the lower portion of the second active pattern 502 and the upper surface of the substrate 500 that are not covered or not overlapped by the second and third masks 510 and 525, and the second active pattern 502 may be transformed into a third active pattern 504.

The third buffer layer 540 may include an oxide, e.g., aluminum silicon oxide.

Figure 18:
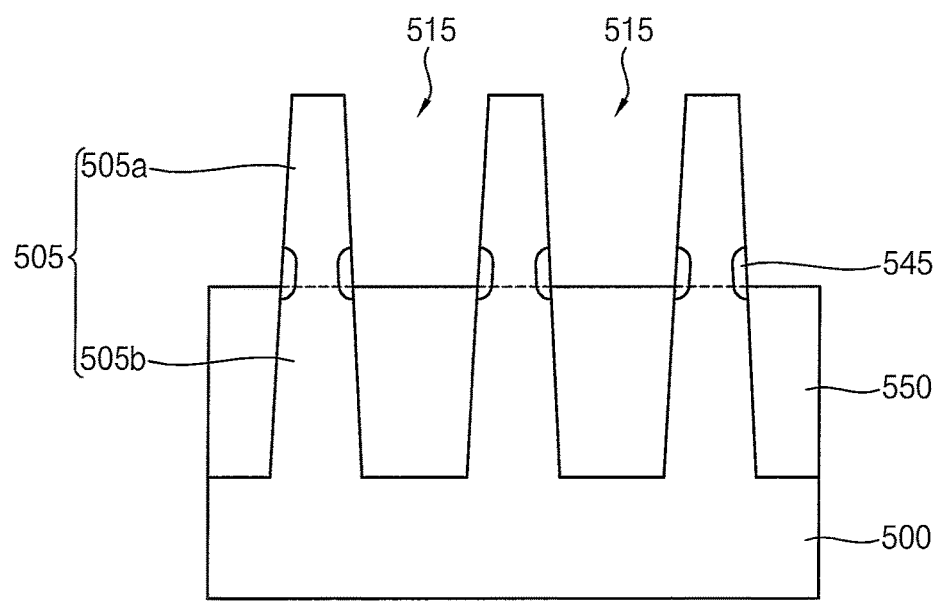

Referring to FIG. 18, the third buffer layer 540 and an upper portion of the substrate 500 may be partially etched using the second and third masks 510 and 525 sequentially stacked on the third active pattern 504, so that the second recess 515 between the second active patterns 504 may be enlarged downwardly.

Accordingly, the third active pattern 504 may be transformed into a fourth active pattern 505, and a portion of the third buffer layer 540 on the lower portion of the third active pattern 504 may be transformed into a third buffer 545.

An isolation pattern 550 may be formed to substantially fill or at least partially fill the enlarged second recess 515 and cover or overlap a lower sidewall of the fourth active pattern 505.

The fourth active pattern 505 may include a second lower active pattern 505b of which a sidewall may be covered or overlapped by the isolation pattern 550, and a second upper active pattern 505a protruding from an upper surface of the isolation pattern 550 upwardly in the vertical direction perpendicular to the substrate.

In FIG. 18, the isolation pattern 550 partially covers or overlaps a sidewall of the third buffer 545, however, the inventive concepts may not be limited thereto. That is, the isolation pattern 550 may not cover or overlap the sidewall of the third buffer 545, or may entirely cover or overlap the sidewall of the third buffer 545.

In example embodiments, a lower surface of the second upper active pattern 505a and an upper surface of the second lower active pattern 505b may contact each other between the third buffers 545.

In example embodiments, sidewalls of the second lower active pattern 505b, the third buffer 545, and the second upper active pattern 505a may have a constant slope with respect to the upper surface of the substrate 500. In some embodiments, an inner sidewall of the third buffer 545 may have a slope with respect to the upper surface of the substrate 500 that may change in the vertical direction perpendicular to the substrate.

As illustrated in FIG. 18, the third buffer 545 including an oxide having a band gap greater than those of the second lower active pattern 505b and the second upper active pattern 505a may be at least partially interposed between the second lower active pattern 505b and the second upper active pattern 505a, and thus a width of a lower portion of the second upper active pattern 505a contacting an upper portion of the second lower active pattern 505b, so that leakage currents from the second upper active pattern 505a to the second lower active pattern 505b may be reduced.

FIGS. 19 to 29 are plan views and/or cross-sectional views illustrating a method of manufacturing a semiconductor device in accordance with example embodiments. Particularly, FIGS. 19, 22, 24 and 27 are the plan views, and FIGS. 20, 21, 23, 25, 26, 28 and 29 are the cross-sectional views.

Figure 20:
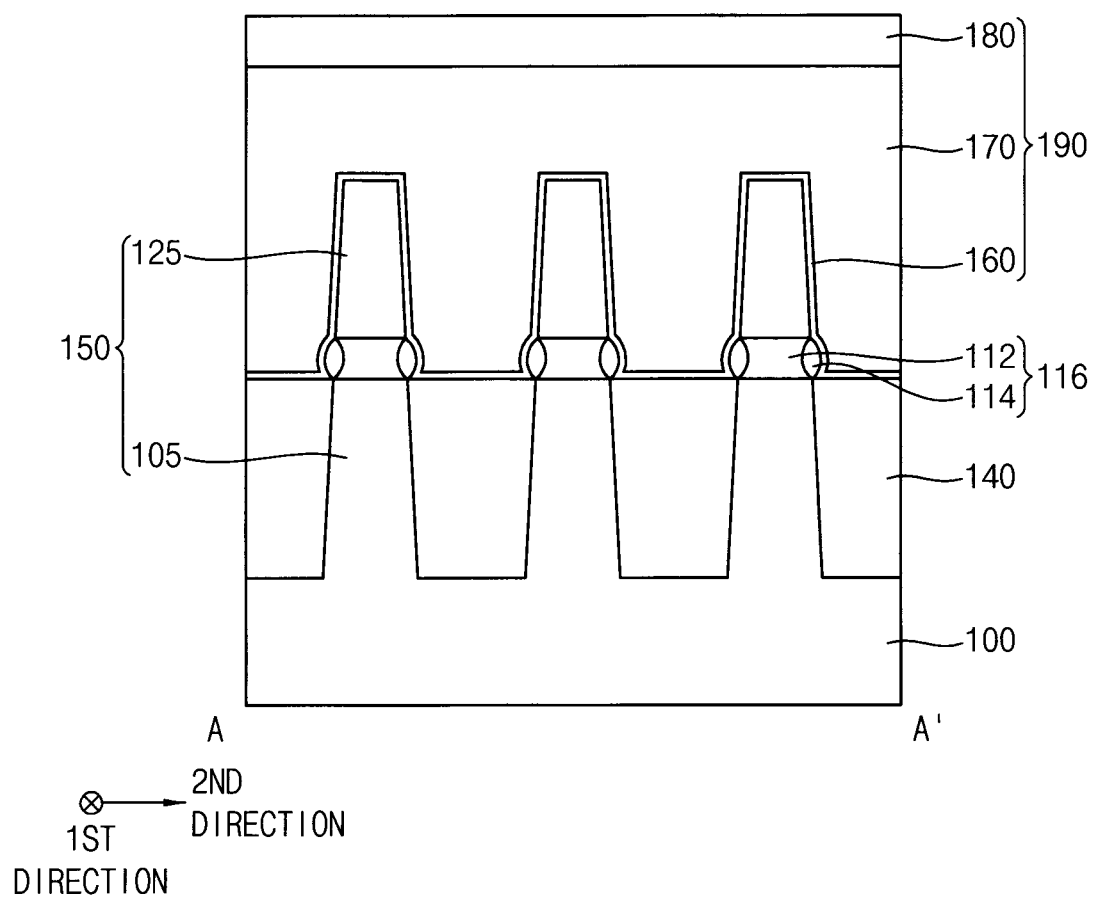
Figure 21:
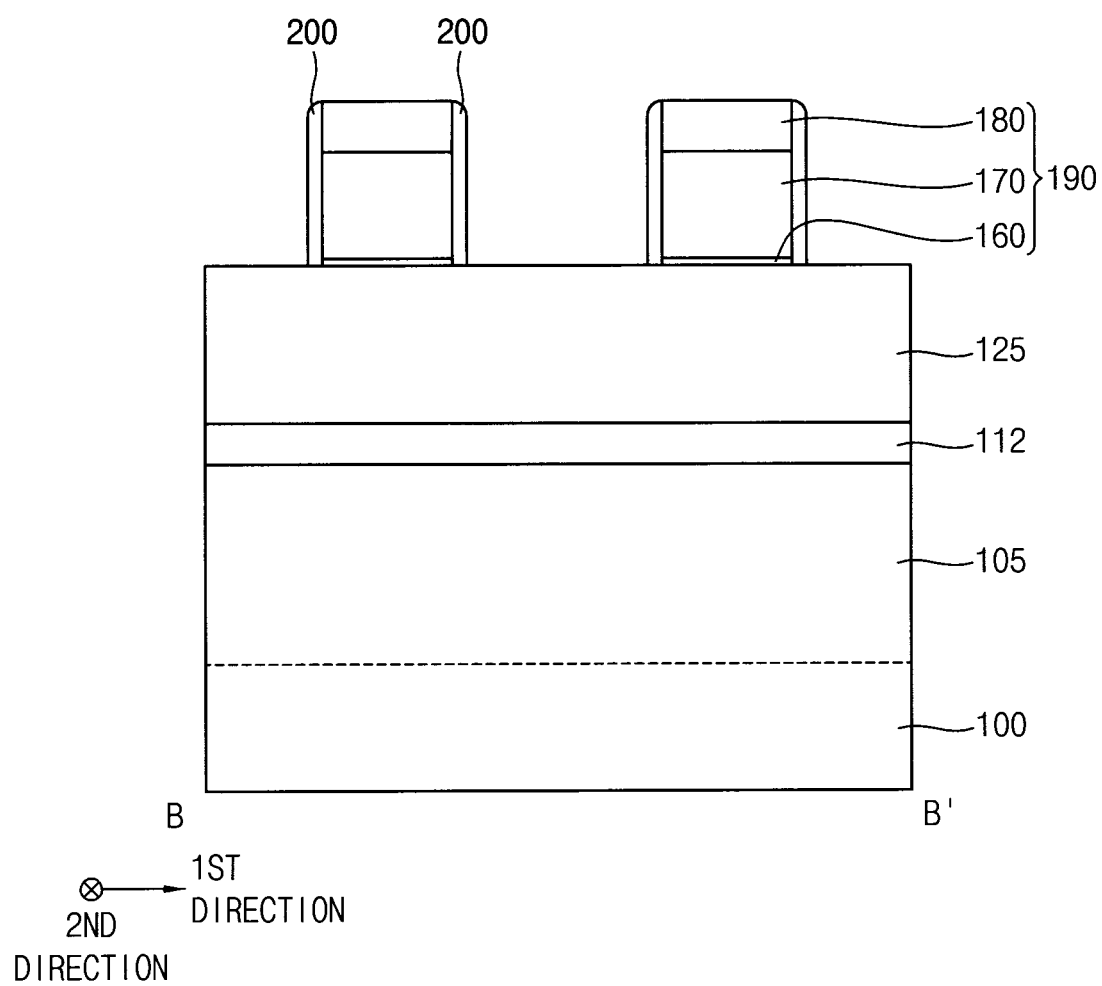
Figure 23:
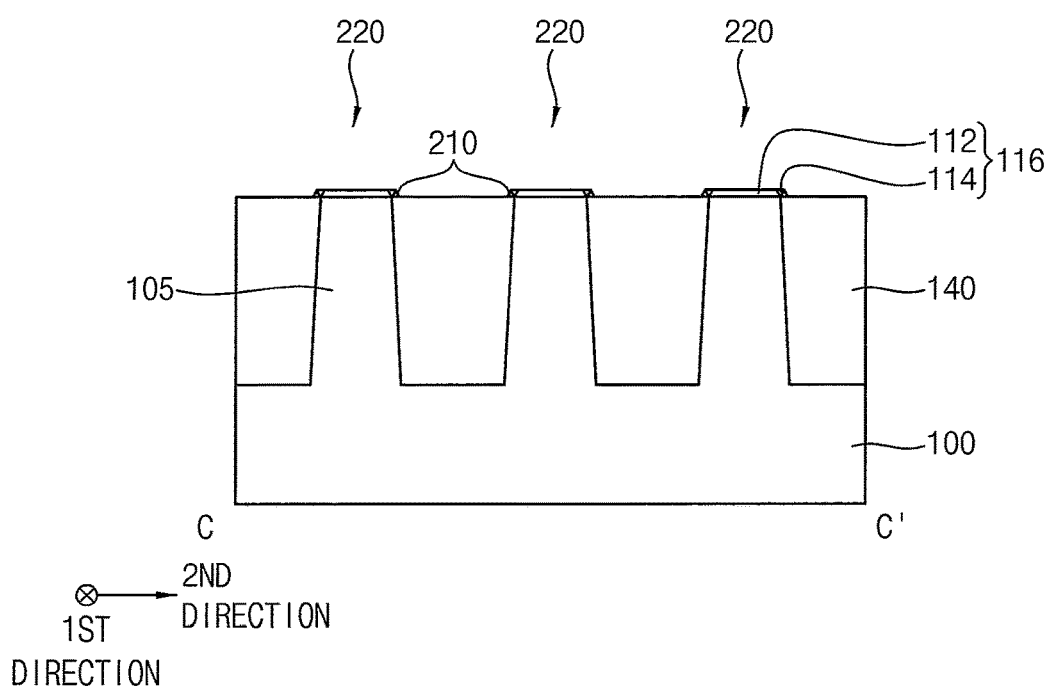
Figure 25:
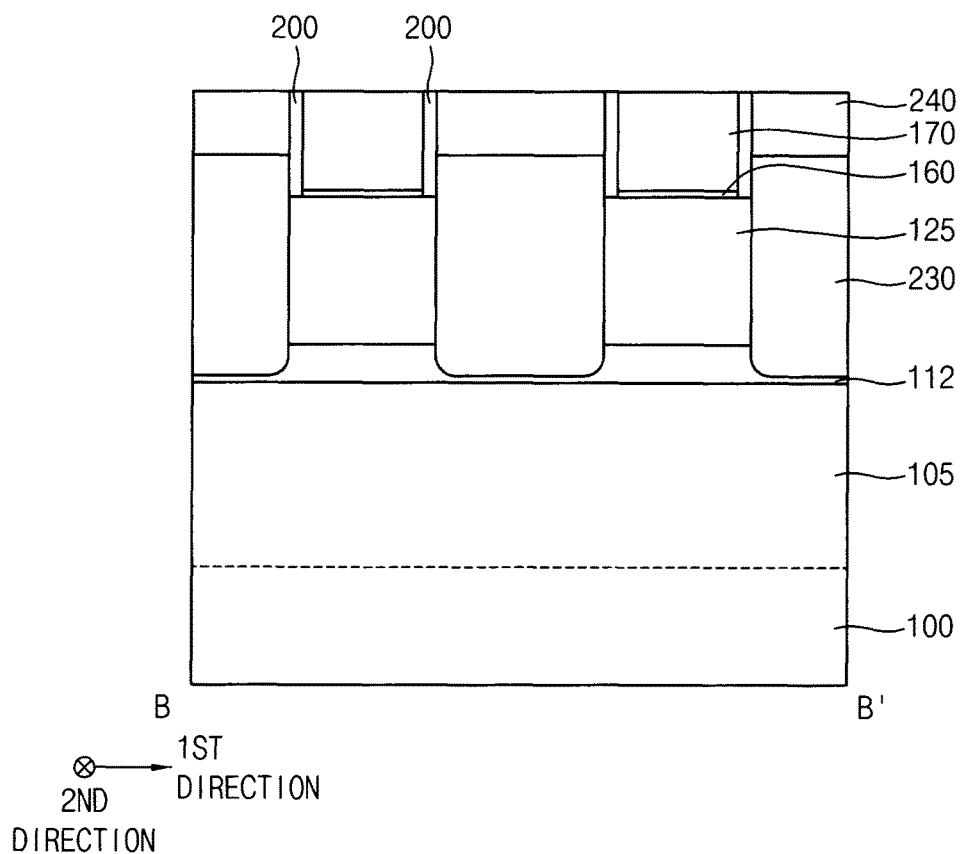
Figure 26:
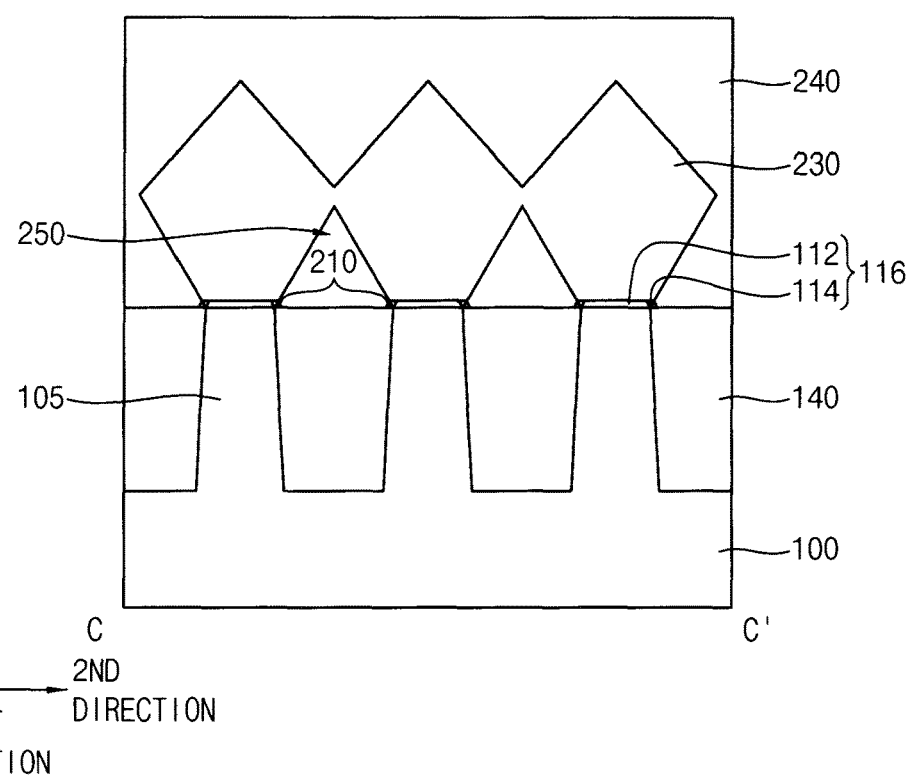
Figure 28:
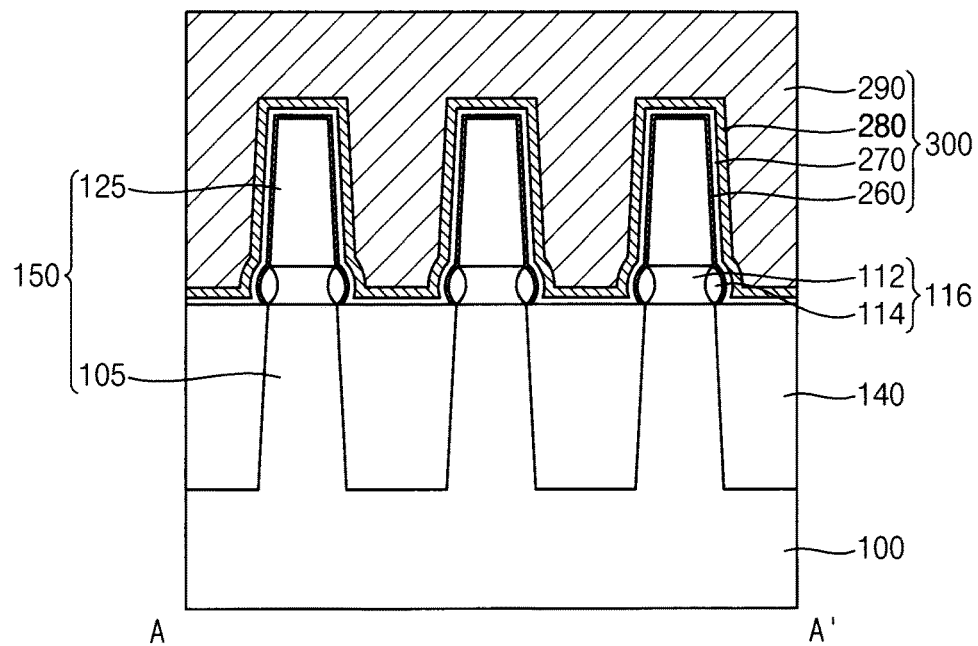
Figure 29:
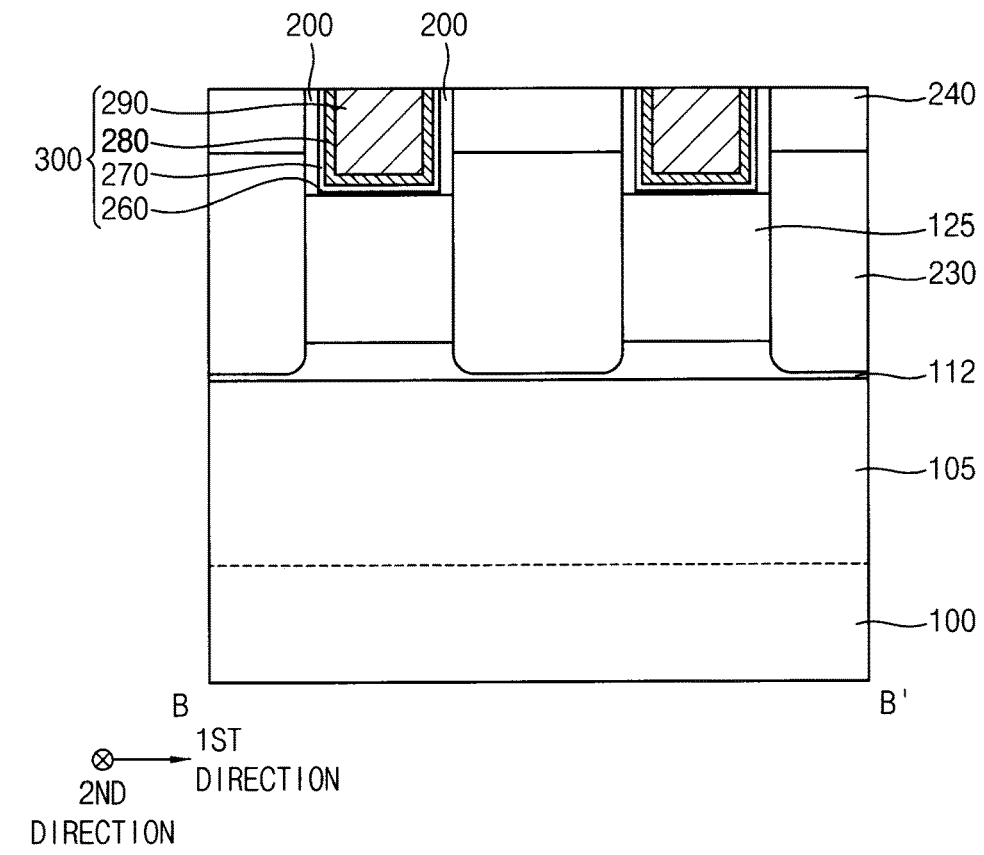

FIGS. 20 and 28 are cross-sectional views taken along lines A-A' of corresponding plan views, respectively, FIGS. 21, 25 and 29 are cross-sectional views taken along lines B-B' of corresponding plan views, respectively, and FIGS. 23 and 26 are cross-sectional views taken along lines C-C' of corresponding plan views, respectively.

The semiconductor device may include an active pattern structure substantially the same as or similar to that of FIG. 6, and thus like reference numerals refer to like elements, and repetitive descriptions thereon are omitted herein.

Figure 19:
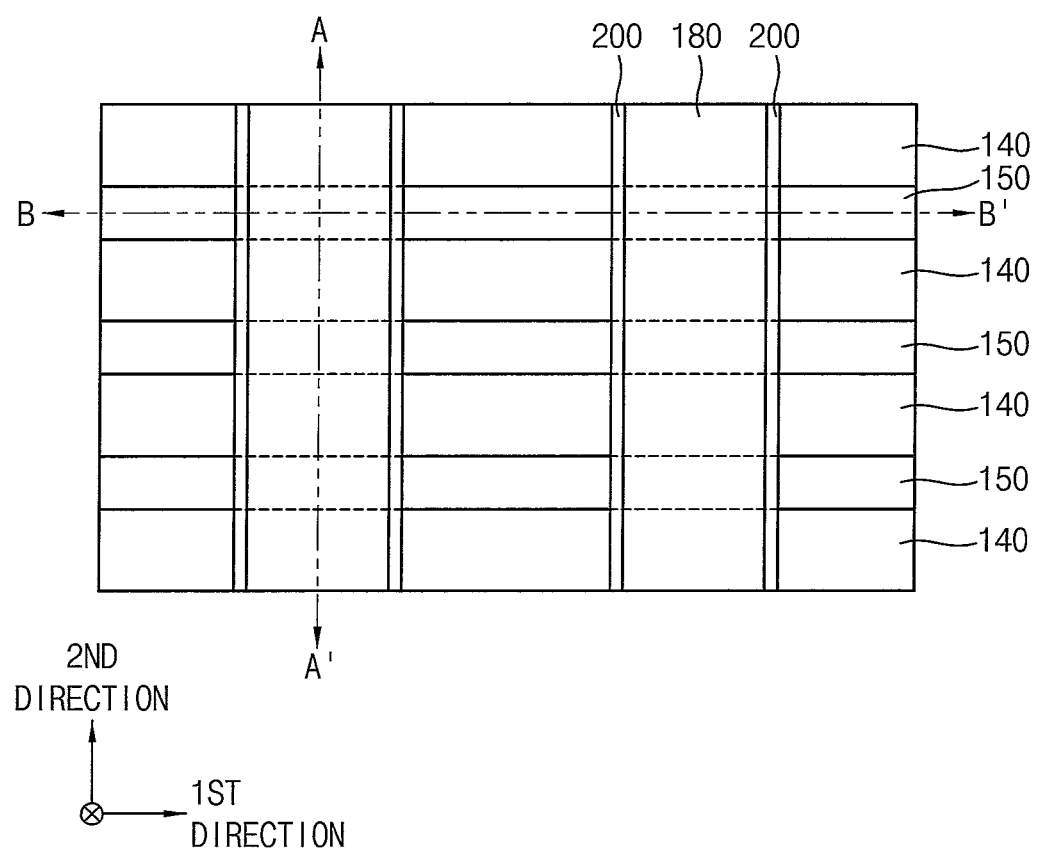
FIGS. 19 to 29 are plan views and/or cross-sectional views illustrating a method of manufacturing a semiconductor device in accordance with example embodiments.

Referring to FIGS. 19 to 21, a dummy gate structure 190 may be formed on the buffer structure 116, the first upper active pattern 125, and the isolation pattern 140.

The dummy gate structure 190 may be formed by sequentially forming a dummy gate insulation layer, a dummy gate electrode layer, and a dummy gate mask layer, and patterning the dummy gate mask layer to form a dummy gate mask 180, and sequentially etching the dummy gate electrode layer and the dummy gate insulation layer using the dummy gate mask 180 as an etching mask.

Accordingly, the dummy gate structure 190 including a dummy gate insulation pattern 160, a dummy gate electrode 170 and the dummy gate mask 180 sequentially stacked may be formed on the substrate 100.

The dummy gate insulation layer may include an oxide, e.g., silicon oxide, the dummy gate electrode layer may include, e.g., polysilicon, and the dummy gate mask layer may include a nitride, e.g., silicon nitride.

The dummy gate insulation layer, the dummy gate electrode layer and the dummy gate mask layer may be formed by a chemical vapor deposition (CVD) process, an atomic layer deposition (ALD) process, etc. In some embodiments, the dummy gate insulation layer may be formed by a thermal oxidation process on the first upper active pattern 125, and in this case, the dummy gate insulation layer may be formed only on an upper surface of the first upper active pattern 125.

In example embodiments, the dummy gate structure 190 may extend in the second direction, and a plurality of the dummy gate structures 190 may be formed in the first direction.

After forming a spacer layer on the first upper active pattern 125 and the isolation pattern 140 to cover or overlap the dummy gate structure 190, the spacer layer may be anisotropically etched to form a gate spacer 200 on each of opposite sidewalls of the dummy gate structure 190 in the first direction.

A fin spacer 210 may be formed on each of opposite sidewalls of the second buffer 114 in the second direction. However, the inventive concepts may not be limited thereto. That is, the fin spacer 210 may be also formed on each of opposite sidewalls of the first upper active pattern 125 in the second direction, which will be illustrated with reference to FIGS. 30 to 32 subsequently.

The spacer layer may include a nitride, e.g., silicon nitride. In some embodiments, the spacer layer may have a stacked structure including a nitride layer and an oxide layer sequentially stacked.

Figure 22:
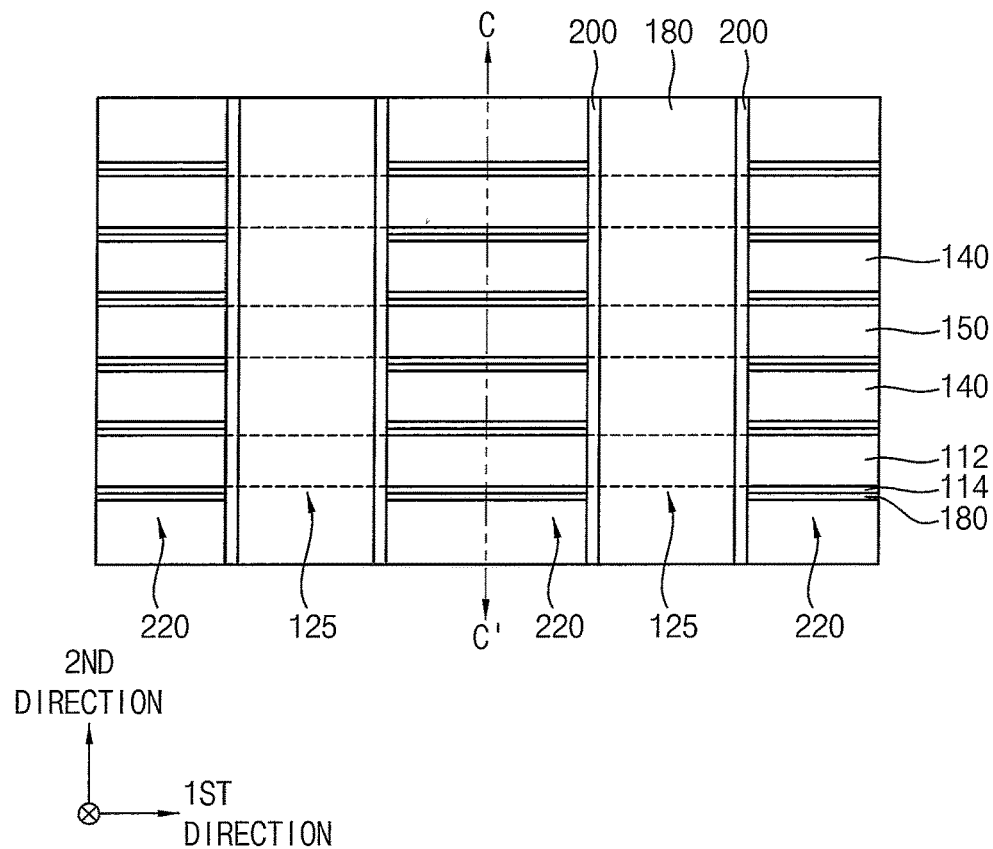

Referring to FIGS. 22 and 23, a portion of the first upper active pattern 125 adjacent the gate spacer 200 and a portion of the buffer structure 116 thereunder may be etched to form a third recess 220.

In FIG. 23, the portion of the first upper active pattern 125 and the portion of the buffer structure 116 are partially etched to form the third recess 220, and thus a bottom of the third recess is higher than a bottom surface of the buffer structure 116, however, the inventive concepts may not be limited thereto. That is, the third recess 220 may be formed by etching only an upper portion of the first upper active pattern 125 so that the bottom of the third recess 220 may be higher than an upper surface of the buffer structure 116, which will be illustrated with reference to FIGS. 30 to 32 subsequently.

When the third recess 220 is formed, the fin spacer 210 on each of opposite sidewalls of the second buffer 114 may be partially or entirely removed.

In example embodiments, the etching process for forming the third recess 220 and the etching process for forming the gate spacer 200 and the fin spacer 210 may be performed in-situ.

Figure 24:
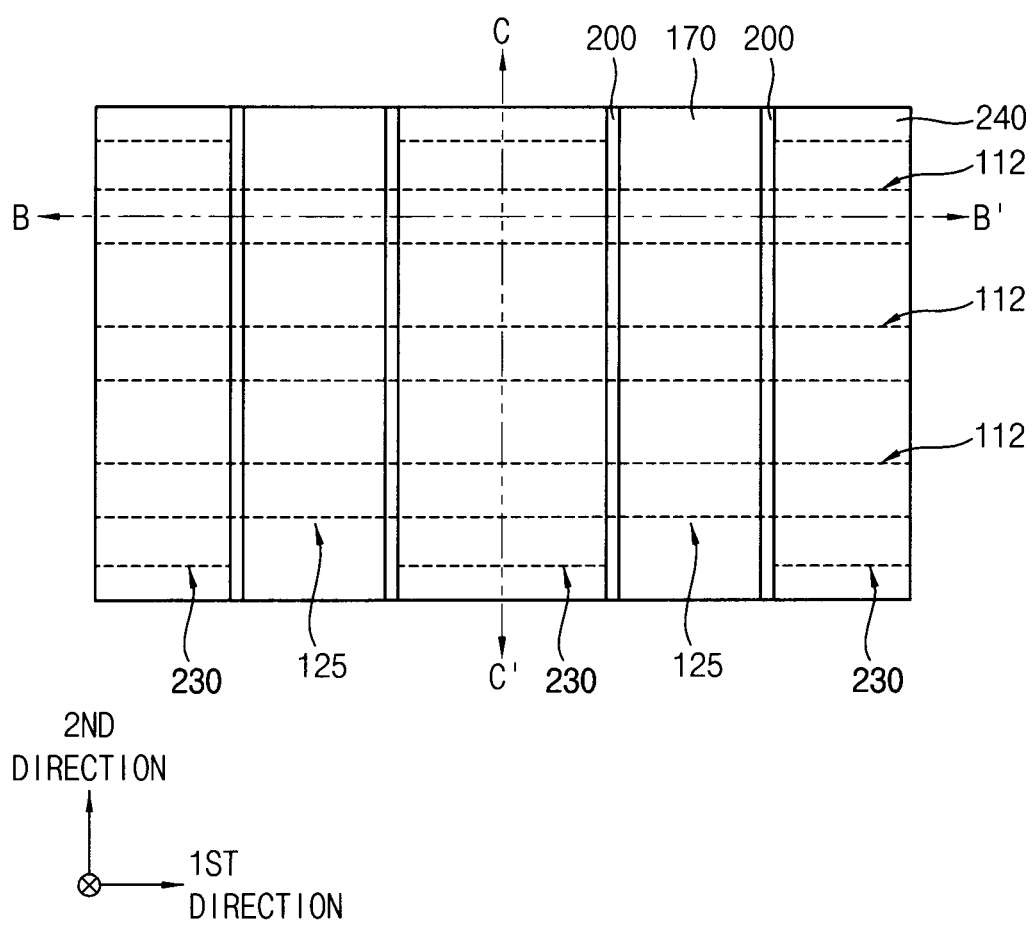

Referring to FIGS. 24 to 26, a source/drain layer 230 may be formed to fill or at least partially fill the third recess 220.

In example embodiments, the source/drain layer 230 may be formed by a selective epitaxial growth (SEG) process using an upper surface of first buffer 112 exposed by the third recess 220 as a seed.

In example embodiments, the SEG process may be performed using a silicon source gas, a germanium source gas, an etching gas and a carrier gas, and thus a single crystalline silicon-germanium layer may be formed to serve as the source/drain layer 230. Additionally, the SEG process may be performed using a p-type impurity source gas, and thus a single crystalline silicon-germanium layer doped with p-type impurities may be formed to serve as the source/drain layer 230.

According to some embodiments, the SEG process may be performed using a silicon source gas, a carbon source gas, an etching gas and a carrier gas. Thus a single crystalline silicon carbide layer may be formed as the source/drain layer 230. Additionally, the SEG process may be performed using an n-type impurity source gas, and thus a single crystalline silicon carbide layer doped with n-type impurities may be formed to serve as the source/drain layer 230. Otherwise, the SEG process may be performed using a silicon source gas, an etching gas and a carrier gas, and thus a single crystalline silicon layer may be formed as the source/drain layer 230. In this case, a single crystalline silicon layer doped with n-type impurities may be formed using an n-type impurity source gas together with the above-mentioned gases.

The source/drain layer 230 may grow not only in the vertical direction perpendicular to the substrate 100, but also in a horizontal direction parallel to the top surface of the substrate 100 to fill or at least partially fill the third recess 220. The source/drain layer 230 may contact a sidewall of the gate spacer 200. In example embodiments, the source/drain layer 230 may have a cross-section taken along the second direction having a pentagon-like shape.

In example embodiments, when neighboring ones of the buffer structures 116 disposed in the second direction are close to each other, the source/drain layers 230 growing on the neighboring ones of the first buffer 112, respectively, may be merged with each other. FIG. 26 shows that three source/drain layers 230 grown on neighboring three first buffers 112, respectively, are merged with each other, however, the inventive concepts may not be limited thereto. Thus, for example, two or more than three source/drain layers 230 may be grown to be merged with each other.

An insulating interlayer 240 covering or overlapping the dummy gate structure 190, the gate spacer 200, the fin spacer 210 and the source/drain layer 230 may be formed on the first upper active pattern 125 and the isolation pattern 140 to a sufficient height, and the insulating interlayer 240 may be planarized until an upper surface of the dummy gate electrode 170 of the dummy gate structure 190 may be exposed. In the planarization process, the dummy gate mask 180 and an upper portion of the gate spacer 200 may be removed.

A space between the merged source/drain layer 230 and the isolation pattern 140 may not be completely filled with the insulating interlayer 240, and thus an air gap 250 may be formed therein.

The insulating interlayer 240 may include a silicon oxide, e.g., tonen silazene (TOSZ). The planarization process may be performed by a chemical mechanical polishing (CMP) process and/or an etch back process.

Figure 27:
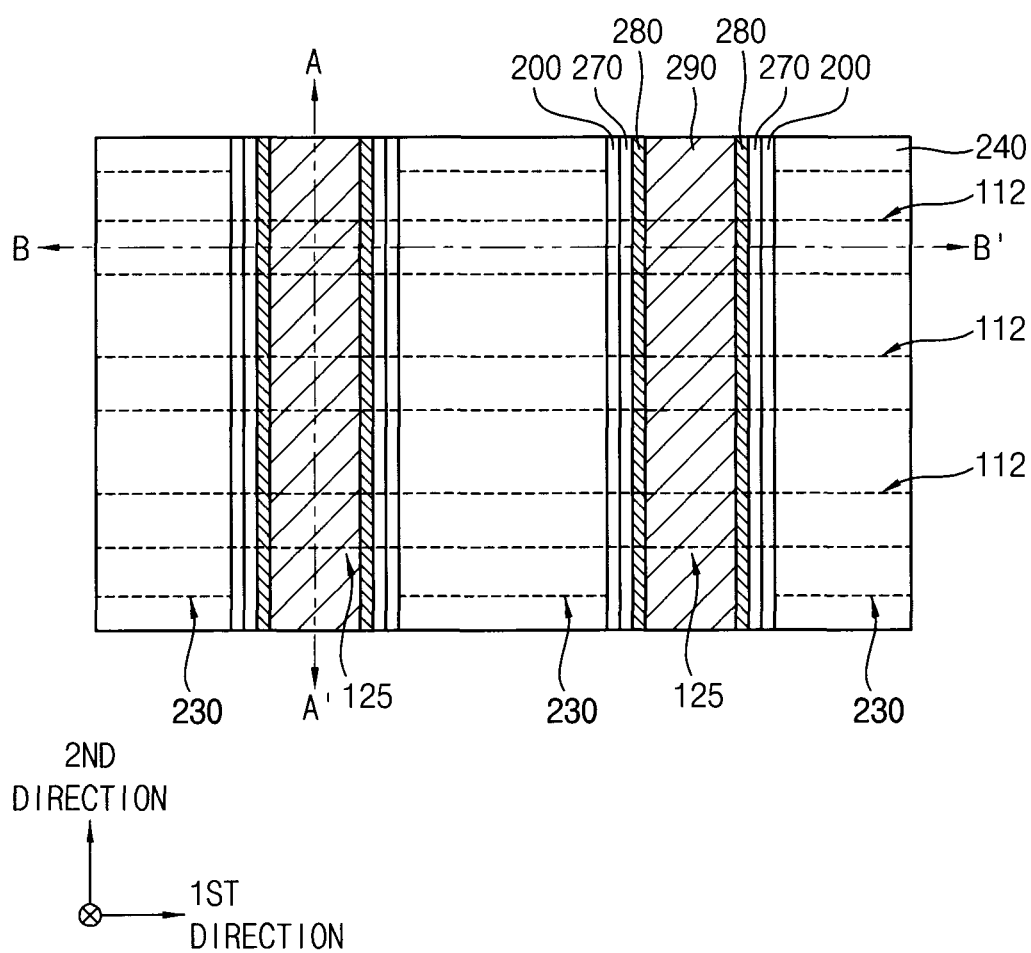

Referring to FIGS. 27 to 29, the exposed dummy gate electrode 170 and the dummy gate insulation pattern 160 may be removed to form an opening exposing an inner sidewall of the gate spacer 200 and an upper surface of the first upper active pattern 125, and a gate electrode structure 300 may be formed to fill or at least partially fill the opening.

In example embodiments, the exposed dummy gate electrode 170 and the dummy gate insulation pattern 160 may be removed by a dry etching process and a wet etching process. The wet etching process may be performed using, e.g., hydrofluoric acid.

Particularly, the gate electrode structure 300 may be formed by performing a thermal oxidation process on the upper surface of the first upper active pattern 125 exposed by the opening to form an interface pattern 260, sequentially forming a gate insulation layer and a workfunction control layer on the interface pattern 260, the isolation pattern 140, the gate spacer 200 and the insulating interlayer 240, forming a gate electrode layer on the workfunction control layer to fill or at least partially fill the remaining portion of the opening, and planarizing the gate electrode layer, the workfunction control layer and the gate insulation layer until an upper surface of the insulating interlayer 240 may be exposed. The gate electrode structure 300 may include the interface pattern 260, a gate insulation pattern 270, a workfunction control pattern 280, and a gate electrode 290.

The workfunction control layer and the gate electrode layer may be formed by a CVD process, an ALD process, a PVD process, etc. A thermal treatment such as a rapid thermal annealing (RTA) process, a spike RTA process, a flash RTA process, or a laser annealing process, etc., may be further performed.

In some embodiments, the interface pattern 260 may be formed by a CVD process or an ALD process as the gate insulation layer or the gate electrode layer, and in this case, the interface pattern 260 may be formed not only on the upper surface of the first upper active pattern 125 but also on the upper surface of the isolation pattern 140 and the inner sidewall of the gate spacer 200. In some embodiments, the interface pattern 260 may not be formed.

The gate insulation pattern 270 and the workfunction control pattern 280 may be sequentially stacked on a surface of the interface pattern 260, the upper surface of the isolation pattern 140 and the inner sidewall of the gate spacer 200, and the gate electrode 290 may be formed on the workfunction control pattern 280 to fill or at least partially fill the remaining portion of the opening.

The gate electrode structure 300 and the source/drain layer 230 may form a transistor. The transistor may be a PMOS transistor or an NMOS transistor according to a conductivity type of the source/drain layer 230.

Upper portions of the gate electrode structure 300 and the gate spacer 200 may be removed to form a fourth recess (not shown), a capping pattern (not shown) may be formed to fill the fourth recess, and a contact plug (not shown), a via (not shown) and a wiring (not shown) may be further formed to be electrically connected to the source/drain layer 230 and/or the gate electrode structure 300 so as to complete the fabrication of the semiconductor device.

As illustrated above, the second buffer 114 including an oxide having a band gap greater than those of the first lower active pattern 105 and the first upper active pattern 125 may be interposed therebetween, and the first buffer 112 not including an oxide may have a width smaller than that of the first upper active pattern 125, so that leakage currents from the first upper active pattern 125 to the first lower active pattern 105 may be reduced.

Figure 30:
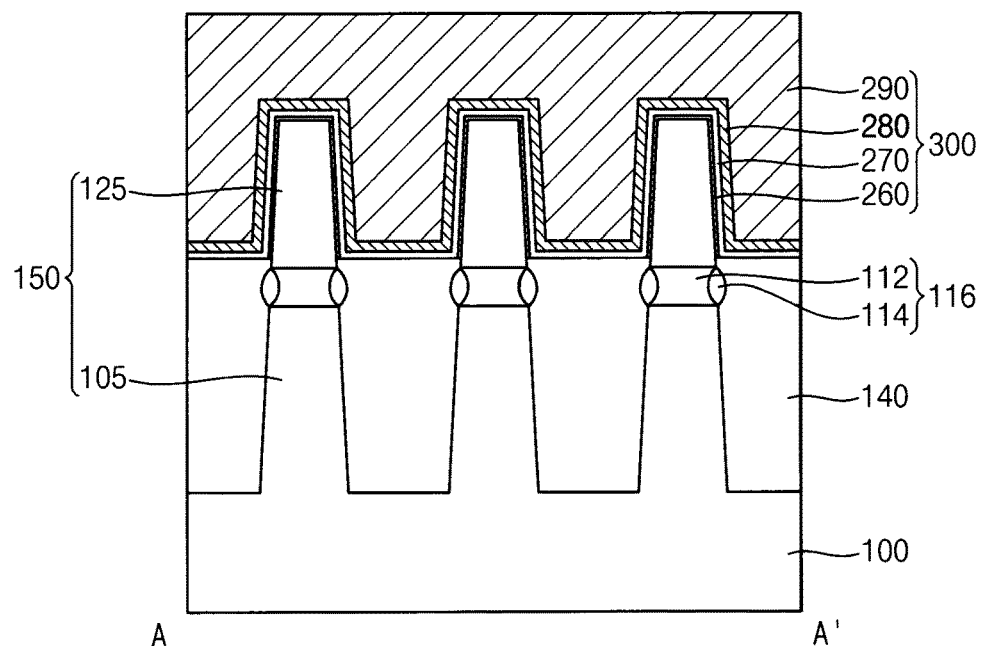
FIGS. 30 to 32 are cross-sectional views illustrating a semiconductor device in accordance with example embodiments.
Figure 31:
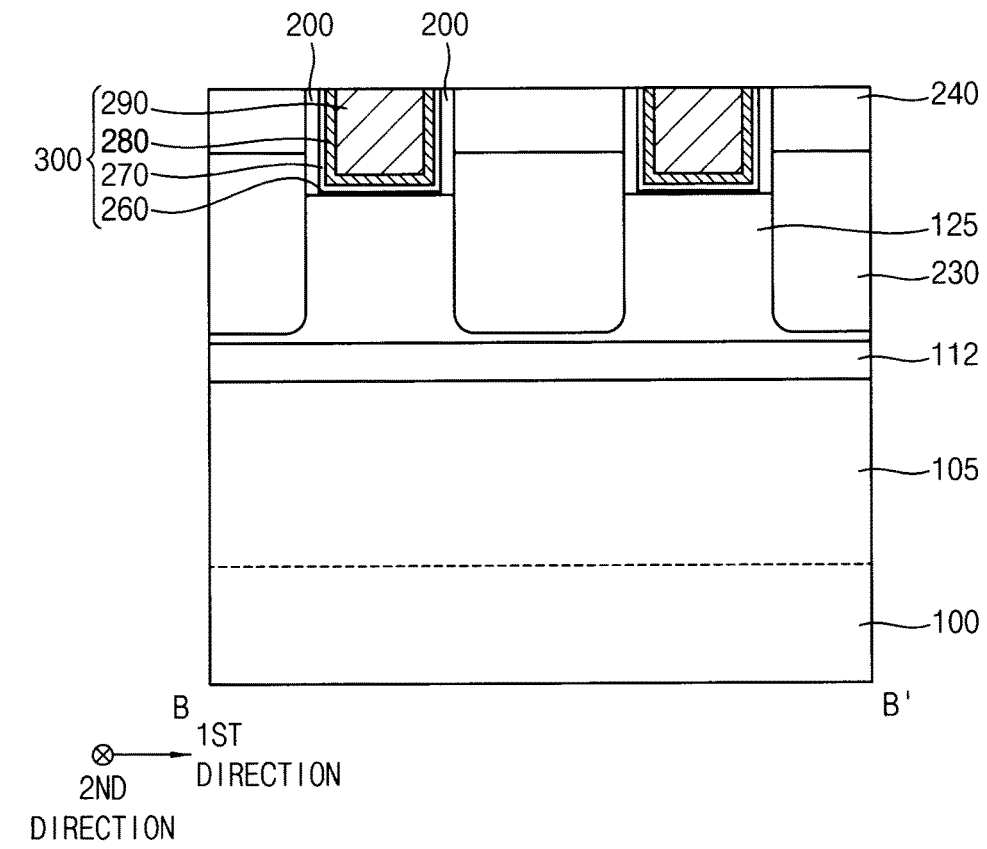
Figure 32:
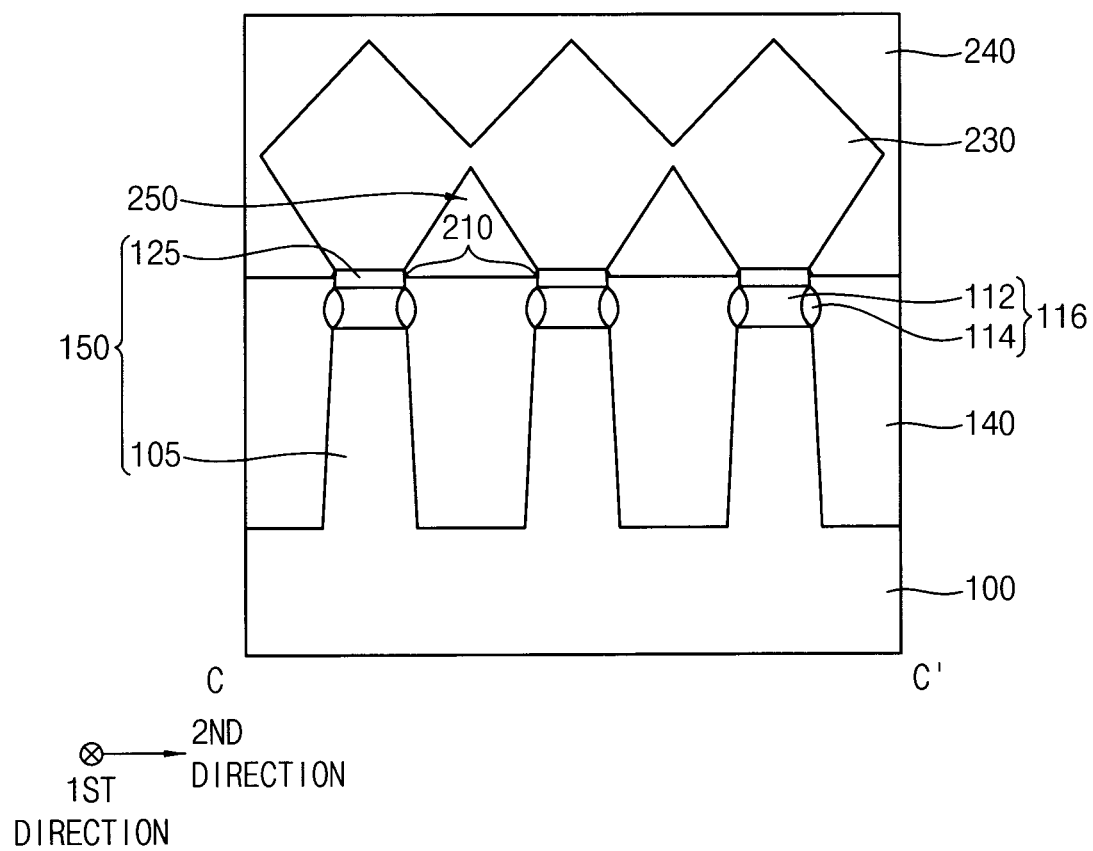

FIGS. 30 to 32 are cross-sectional views illustrating a semiconductor device in accordance with example embodiments.

FIG. 30 is a cross-sectional view taken along a line A-A' of a corresponding plan view, FIG. 31 is a cross-sectional view taken along a line B-B' of a corresponding plan view, and FIG. 32 is a cross-sectional view taken along a line C-C' of a corresponding plan view.

This semiconductor device may be substantially the same as or similar to that of FIGS. 27 to 29 except for the shape of the active pattern structure under the source/drain layer 230 and the gate structure 300. Thus, like reference numerals refer to like elements, and detailed descriptions thereon are omitted herein.

Referring to FIGS. 30 to 32, the semiconductor device may include the active pattern structure shown in FIG. 7 instead of that shown in FIG. 6.

Thus, the fin spacer 210 may be formed on each of opposite sidewalls of the first upper active pattern 125 in the second direction, and the source/drain layer 230 may be formed on the first upper active pattern 125.

Particularly, the third recess 220 (shown in FIG. 23) for forming the source/drain layer 230 may be formed by etching only an upper portion of the first upper active pattern 125, and the buffer structure 116 under the first upper active pattern 125 may not be etched during the etching process. Thus, a bottom of the third recess 220 may be higher than an upper surface of the buffer structure 116, and the source/drain layer 230 may be formed on the first upper active pattern 125.

As described above, although the present invention has been described with reference to example embodiments, those skilled in the art will readily appreciate that many modifications are possible in the example embodiments without materially departing from the novel teachings and advantages of the present inventive concept.

What is claimed is:

1. A semiconductor device, comprising:
   an active pattern structure on a substrate, the active pattern structure comprising:
      a lower active pattern protruding from an upper surface of the substrate in a vertical direction substantially perpendicular to the upper surface of the substrate;
      an upper active pattern directly on the lower active pattern; and
      a buffer between the lower active pattern and the upper active pattern, wherein the buffer contacts edge portions of the lower and upper active patterns and comprises aluminum silicon oxide;
   an isolation pattern on the substrate, wherein the isolation pattern is on at least a portion of a sidewall of the active pattern structure;
   a gate electrode structure on the active pattern structure; and
   a source/drain layer on a portion of the active pattern structure adjacent the gate electrode structure.

2. The semiconductor device of claim 1, wherein a central portion of an upper surface of the lower active pattern and a central portion of a lower surface of the lower active pattern directly contact each other.

3. The semiconductor device of claim 1, wherein the buffer has a ring shape that surrounds portions of the lower active pattern and the upper active pattern.

4. The semiconductor device of claim 1, wherein sidewalls of the lower active pattern, the buffer, and the upper active pattern have a constant slope with respect to the upper surface of the substrate.

5. The semiconductor device of claim 1, wherein an inner sidewall of the buffer has a slope with respect to the upper surface of the substrate that changes in the vertical direction.

6. The semiconductor device of claim 1, wherein the lower and upper active patterns comprise substantially a same semiconductor material.

7. The active pattern structure of claim 1, wherein the isolation pattern is on a sidewall of the lower active pattern and a sidewall of the buffer.

8. The active pattern structure of claim 1, wherein an upper surface of the isolation pattern is substantially coplanar with or higher than a lower surface of the buffer with respect to the substrate.

9. The active pattern structure of claim 1, wherein an upper surface of the isolation pattern is lower than an upper surface of the buffer with respect to the substrate.

* * * * *